United States Patent [19]

Kessler

[11] Patent Number: 5,533,152
[45] Date of Patent: Jul. 2, 1996

[54] METHOD AND APPARATUS FOR COUPLING LIGHT EMITTED FROM A MULTI-MODE LASER DIODE ARRAY TO A MULTI-MODE OPTICAL FIBER

[75] Inventor: David Kessler, Rochester, N.Y.

[73] Assignee: Eastman Kodak Company, Rochester, N.Y.

[21] Appl. No.: 434,145

[22] Filed: May 2, 1995

[51] Int. Cl.⁶ ..................................................... G02B 6/27
[52] U.S. Cl. ................................. 385/11; 385/33; 385/36; 359/495
[58] Field of Search ...................... 385/11, 31–36; 359/495, 497, 496, 494, 489

[56] References Cited

U.S. PATENT DOCUMENTS

| | | | |
|---|---|---|---|
| 4,799,210 | 1/1989 | Wilson et al. | 369/110 |
| 4,822,151 | 4/1989 | Tatsuno et al. | 359/495 |
| 4,917,453 | 4/1990 | Block et al. | 350/96.20 |
| 5,015,055 | 5/1991 | Takamatsu et al. | 350/96.15 |
| 5,040,862 | 8/1991 | Burton et al. | 385/33 |
| 5,164,724 | 11/1992 | Hartley et al. | 341/95 |
| 5,425,117 | 6/1995 | Miesak | 385/33 |

Primary Examiner—John D. Lee
Assistant Examiner—Phan T. H. Palmer
Attorney, Agent, or Firm—Nelson Adrian Blish

[57] ABSTRACT

A method and apparatus for coupling a multi-mode diode laser with an optical fiber suitable for incorporation into fiber optic medical instruments, welding equipment, laser copiers, laser printers and facsimile machines. In one embodiment, light emitting from a diode laser 40 is collected by collecting optics. One-half of the light which passes through the collecting optics is passed through a half-wave plate 44 which rotates the polarization of that light which passes through the half-wave plate 44 thereby producing two distinct beams of polarized light (43,49). The two beams of light then pass through a Wollaston or Rochon prism 46 which causes the two beams to overlap upon exiting the prism, where the exiting light is allowed to enter an optical fiber 48. In another embodiment, one-half of the light emitted from a laser diode 40 is rotated by a half-wave plate 44. Both rotated and non-rotated light is then passed through collecting optics and subsequently through a double refractor 50 such that the rotated and non-rotated light is overlapped onto one another and then subsequently inserted into an optical fiber 48.

6 Claims, 3 Drawing Sheets

METHOD AND APPARATUS FOR COUPLING LIGHT EMITTED FROM A MULTI-MODE LASER DIODE ARRAY TO A MULTI-MODE OPTICAL FIBER

BACKGROUND OF THE INVENTION

The invention relates generally to the field of fiber optics, and in particular to a method and apparatus for coupling light emitted from a multi-mode laser diode array to a multi-mode optical fiber.

Systems incorporating a laser light source optically coupled to an optical fiber are well known and find an ever-increasing variety of applications. Such systems include fiber optic communications systems, fiber optic medical instruments, welding equipment, laser copiers, laser printers and facsimile machines.

FIG. 1 is a cross-sectional view of a conventional optical fiber having a core 10 and cladding 20 and shows that an angle $\theta_c$ defines a maximum launch angle, $\phi_c$, at which guided light rays 30 may be injected into the optical fiber. This launch angle is usually given in terms of numerical aperture (NA) which is commonly defined by the following equation:

$$NA = \sin \phi_c = \sqrt{n_1^2 - n_2^2}$$

where $n_1$ is the index of refraction of the core 10 and $n_2$ is the index of refraction of the cladding 20.

Since energy launched at angles greater than $\phi_c$ is rapidly attenuated, coupling efficiency of a laser diode to a fiber depends upon NA.

High-power laser diodes are usually edge emitting multi-mode lasers. These laser diodes consist of either a single, broad area emitting aperture commonly 1 micron by 200 microns or they are arranged as an array of smaller sized apertures. A divergence angle of the light emitted by such a laser diode array through an array of smaller sized apertures is typically 30 degrees by 10 degrees where the smaller divergence (10 degrees) is the divergence measured along the edge (the longitudinal) direction.

Optical systems are frequently described by an optical invariant, or Lagrange, which is constant for a given optical system. A numerical value for the Lagrange may be calculated in any one of a number of ways known in the art and the Lagrange may then be used to arrive at a value for other quantities of optical significance. The Lagrange in each direction for a laser diode array is defined as half the size of the emitting aperture times half the divergence angle (in radians). In the typical case, the Lagrange invariant in one direction (the "array" direction or long dimension of the emitting aperture) is denoted by $L_a$, and defined as:

$$L_a = (200/2) * (5/57.3) = 8.5 \text{ microns}$$

where 57.3 is the conversion factor for converting degrees to radians. The Lagrange invariant in the other direction, i.e., the "cross array direction" or short dimension of the emitting aperture, $L_{ca}$ is:

$$L_{ca} = 0.5 * 15/57.3 = 0.13 \text{ microns}$$

Since optical fibers are typically radially symmetric, their Lagrange, $L_{fiber}$ is the same in any direction and is therefore given by:

$$L_{fiber} = a * NA$$

where a is the fiber core radius and NA is the Numerical Aperture as previously described.

The capacity of optical systems to transmit light is called "the optical throughput" or "etendue". The optical throughput is an invariant of the non-truncating, non-absorbing and non-diffusing optical system and is proportional to the Lagrange invariants in two directions, namely $L_a * L_{ca}$. When an optical system with a large optical throughput is coupled to an optical system with a lower optical throughput, light loss occurs. Such light loss is avoided when the optical throughput of a receiving system is greater than or equal to the optical throughput of a transmitting system. One way to ensure that the optical throughput of the receiving system is greater than or equal to the optical throughput of the transmitting sywstem, is to have both $L_a$ and $L_{ca}$ of the receiving system greater than or equal to the $L_a$ and $L_{ca}$ of the transmitting system.

For light to be efficiently coupled into the fiber therefore, the Lagrange of the fiber has to be larger than the Lagrange of the laser diode array in both directions. Furthermore, it is desirable to inject light from the laser diode into a fiber having the smallest $L_{fiber}$ possible. In laser printing, for example, where an end of the fiber is imaged onto a media, a lower $L_{fiber}$ results in either a smaller spot of light at the media or a larger depth of focus. Since $L_a > L_{ca}$, it is desirable to minimize $L_a$ so as to permit the coupling of the laser light into a lower $L_{fiber}$.

It is desirable therefore to optically couple a multi-mode laser diode array to an optical fiber in a manner which reduces the overall $L_a$ such that the power and radiance of the laser light transmitted through the optical fiber is increased.

SUMMARY OF THE INVENTION

The present invention efficiently couples a multi-mode laser diode or an array of multi-mode laser diodes to an optical fiber so as to provide laser light of increased power and radiance to appear at an output end of the fiber. The invention comprises—in addition to a multi-mode laser diode and optical fiber, optical components which rotate by 90 degrees polarization of one-half of the laser light and then subsequently overlap this rotated one-half of the laser light onto the other, non-rotated one-half of the laser light. The net effect of this rotation and overlap is to reduce the overall Lagrange invariant in one direction, namely the array direction, or $L_a$.

Viewed from one aspect, the present invention is directed to an apparatus for efficiently coupling the light emitted from a multi-mode laser diode to an optical fiber. One embodiment of the apparatus comprises: a multi-mode laser diode or array of laser diodes; an optical fiber; a collimator, or a collimator and a cylinder lens, located between the laser diode and the optical fiber; a half-wave plate located between the collimator and the optical fiber; and a Wollaston or Rochon prism located between the half-wave plate and the optical fiber.

A second embodiment of the apparatus comprises, in addition to the multi-mode laser diode and optical fiber: a half-wave plate located between the laser diode and a collimator or lens; and a double refractor located between the collimator and the optical fiber.

Viewed from another aspect, the present invention is directed to a method for efficiently coupling a multi-mode laser diode or array of laser diodes to a multi-mode optical fiber. The effect of the method is to reduce the overall Lagrange in the array direction, or $L_a$.

BRIEF DESCRIPTION OF THE DRAWINGS

To facilitate reader understanding, identical reference numerals are used to denote identical or similar elements that are common to the figures. The drawings are not necessarily to scale.

DETAILED DESCRIPTION

I will now describe a preferred embodiment of the invention while referring to the figures, several of which may be simultaneously referred to during the course of the following description.

Figure 1:
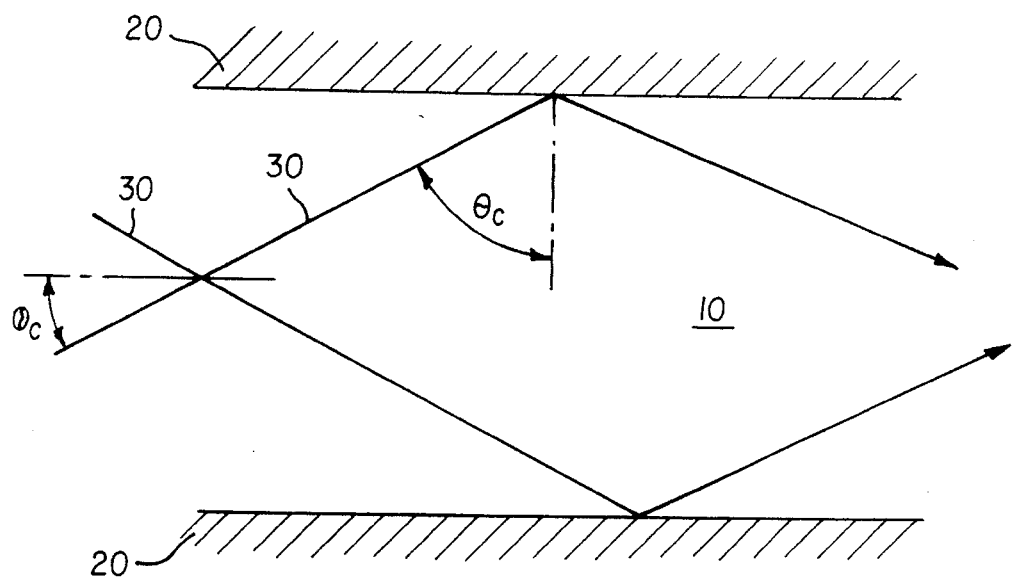
FIG. 1 illustrates a simplified and conventional view of an optical fiber showing the angles of optical significance.
Figure 2:
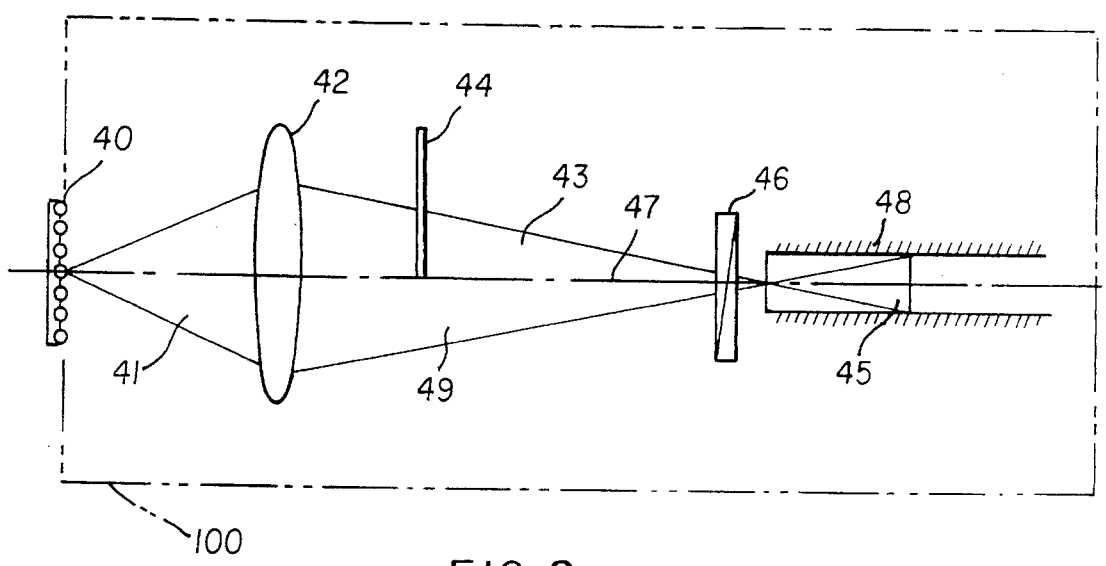
FIG. 2 shows a first embodiment of the present invention.

Referring now to FIG. 2, there is shown optical assembly 100 in accordance with a first embodiment of the present invention. Laser diode array 40, which is well known in the art, emits diverging, and essentially linearly polarized rays of light 41 along optical axis 47 for subsequent transmission through optical fiber 48. Collimator 42, or alternatively, a collimator and a cylindrical lens (not shown), is disposed between laser diode array 40 and optical fiber 48. Although the term collimator commonly implies that an object plane is located at a front focal plane of a lens and an image plane is located at infinity, those skilled in the art understand that with a slight focusing of the lens the fiber may be placed at a finite distance from the lens. Collimator 42 receives the diverging rays of light 41 and functions to reduce the divergence. These light rays 41, upon exiting collimator 42, are focused to converge at optical fiber 48. Half wave plate 44, disposed between collimator 42 and the optical fiber 48, rotates polarization of that portion of light rays 41 which pass through the half wave plate. Upon exiting the half wave plate, the light rays now form two distinct beams of light 43 and 49 which differ in their polarization. Both beams of light 43 and 49, enter a Wollaston prism, or alternatively a Rochon prism, 46. The prism overlaps the two beams of light 43 and 49 onto one another such that the Numerical Aperture of the beam of light 45 exiting the prism is ½ of the Numerical Aperture of the beams 43 and 49 entering the prism. Upon exiting the prism, overlapped light beam 45 strikes an end of optical fiber 48 and is inserted into optical fiber 48 along optical axis 47.

Figure 3:
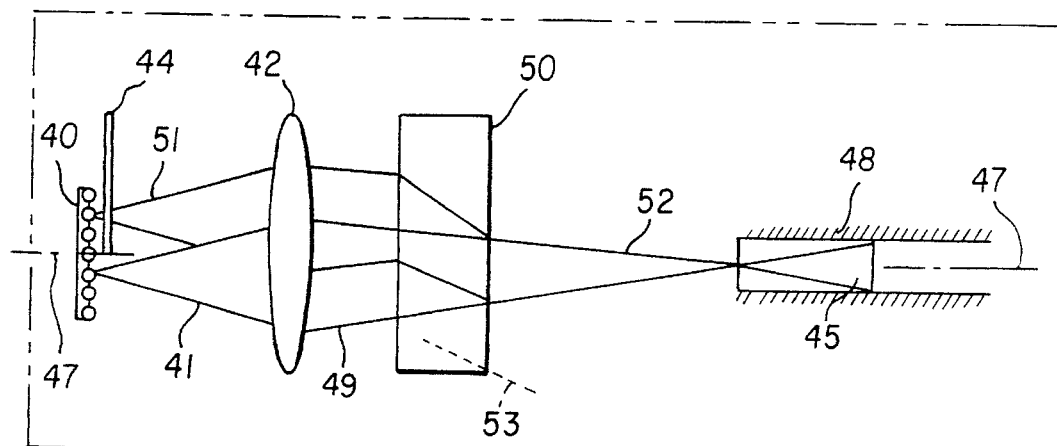
FIG. 3 shows a second embodiment of the present invention.

Referring now to FIG. 3, there is shown an alternative embodiment of the present invention 100. Laser diode array 40, emits diverging rays of light along optical axis 47 for subsequent transmission through optical fiber 48. Half wave plate 44, positioned at the output of laser diode array 40 rotates the polarization of those light rays which pass through the half wave plate such that diverging, rotated rays 51 and diverging non-rotated rays 41 result. Both rotated and non-rotated rays enter collimator 42 and, upon exiting, the resulting light rays are focused so as to converge upon an end of optical fiber 48. Both rotated and non-rotated rays of light then enter double refractor 50 having axis 53 and made of a suitable material, i.e., calcite or quartz, positioned anywhere between collimator 42 and optical fiber 48 such that the double refractor displaces half of the rays of light entering the double refractor by an amount approximately equal to a diameter of the core of optical fiber 48. In this manner, rays of light 51 which are rotated by the half wave plate and rays of light 41 which are not rotated, are overlapped through the effect of the double refractive prism 50 into a single set of rays 52 which converge at, and are inserted into optical fiber 48 along its optical axis 47.

Figure 4:
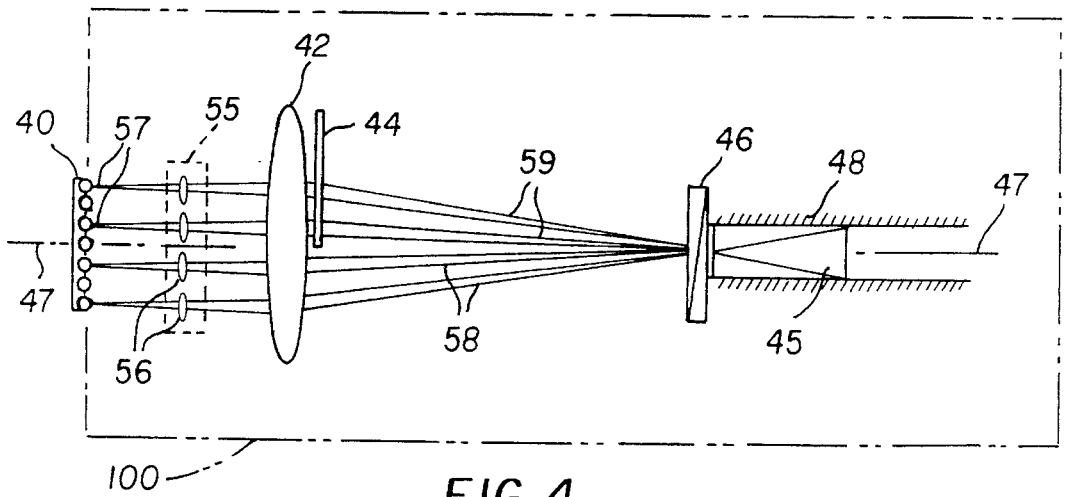
FIG. 4 shows a third embodiment of the present invention.

With reference to FIG. 4, there is shown a third embodiment of the present invention. This third embodiment is similar to the first embodiment shown and described previously, except that single collimator lens 42 shown in FIG. 2, is replaced by lenslet array 55. In the third embodiment shown in FIG. 4, laser diode array 40 emits diverging rays of light for subsequent transmission through optical fiber 48. Lenslet array 55, comprising an array of individual lenses 56, is positioned between laser diode array 40 and optical fiber 48. Each individual lens 56 of lenslet array 55 receives light rays from an individual emitting aperture 57 of laser diode array 40. Although FIG. 4 shows only 4 individual apertures 57, those skilled in the art could readily increase/decrease the number of emitting apertures 57 and individual lenses 56 comprising lenslet array 55. The diverging light rays, upon exiting lenses 56 comprising lenslet array 55, enter single combiner lens 57 which focuses the light rays to converge upon optical fiber 48. Half wave plate 44, positioned between single combiner lens 57 and optical fiber 48, rotates those light rays which pass through the half wave plate such that rotated beams 59 and non-rotated beams 58 result which differ in polarization. Both rotated and non-rotated beams then enter a Wollaston or Rochon prism 46 positioned between half-wave plate 44 and optical fiber 48. The prism overlaps the beams of light 58 and 59 into a single overlapped beam 45 which strikes an end of optical fiber 48 and is inserted into optical fiber 48 along optical axis 47.

The invention can be further understood through the following example in which the invention is incorporated into an optical fiber array, which itself may be incorporated into a print head mechanism. In the field of printing, it has been found desirable to generate an image with a plurality of simultaneously produced dots. A thermal printer that operates in this mode is described in U.S. Pat. No. 5,164,742 entitled "Thermal Printer", issued to Baek et al on Nov. 1, 1992 and is assigned to the present assignee hereof and is incorporated by reference herein.

When operating a printer such as the one described above, it is necessary to accurately focus light from output ends of the optical fibers onto a suitable receiver, such as a photosensitive thermal dye transfer medium. Inasmuch as image data can be reliably assigned to particular optical fibers for transfer to a particular area of the receiver, thus when the light output from the ends of the optical fibers is accurately focused onto the receiver, the printer produces high resolution images. By incorporating the present invention into such a printer, the laser light is output from the ends of the optical fiber with more power and greater depth of field thereby enhancing the accuracy of the light projected onto the receiver and further enhancing the printed image.

Figure 5:
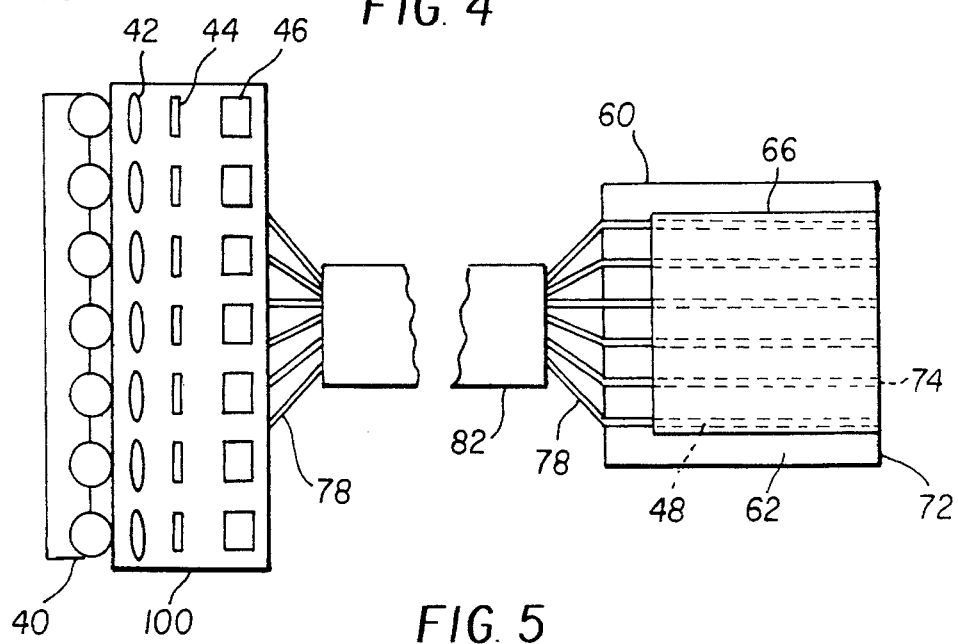
FIG. 5 shown an optical fiber array, which, in conjunction with the present invention, may be incorporated as a component of a printer.

Referring now to FIG. 5, there is shown an optical fiber array 60 coupled to laser diode array 40 by coupling 100. The array 60 comprises a support member 62, a plurality of optical fibers 48 and holding member 66. Optical fibers 48 are supported and positioned in spacer grooves (not shown) formed in the support member 62. Holding member 66 is adhesively bonded to both support member 62 and optical fibers 48 with a bonding material i.e., epoxy, of which a wide variety are well known in the art.

Coupling 100, shows the first embodiment previously described which comprises collimator 42, half-wave plate 44 and Wollaston or Rochon prism 46. Light emitted from individual laser diodes is coupled to individual optical fibers 78 (which are typically bound together by jacket 82) by coupling 100. The light so coupled traverses the length of optical fiber 78 and then exits the fiber at exit end of fiber 78, which is positioned at output end 72 of array 60 and where it may subsequently strike a suitable receiver (not shown).

Array 60 is adapted for installation into a print head of a thermal printer. When installed in a printer, output end 72 is positioned at the object plane of a printing lens (not shown) located within the print head (not shown).

The invention of the present application reduces the numerical aperture at a plane on which a media to be printed lies, and thus reduces the Lagrange invariant $L_a$, in the array direction. Since the Lagrange invariant is proportional to the product of the size of a printed spot and the numerical aperture at the media, I use the reduction of $L_a$ to either reduce the size of a printed spot or the NA, or both. When the size of the printed spot is reduced, the resolution of the printer is increased. When the NA is reduced, the depth of field at the plane of the media is increased. A large depth of field means that the size of the printed spots at the media—which determines the density of the final print, is less dependent on the displacement of the media such as caused by a "drum runout".

Figure 6:
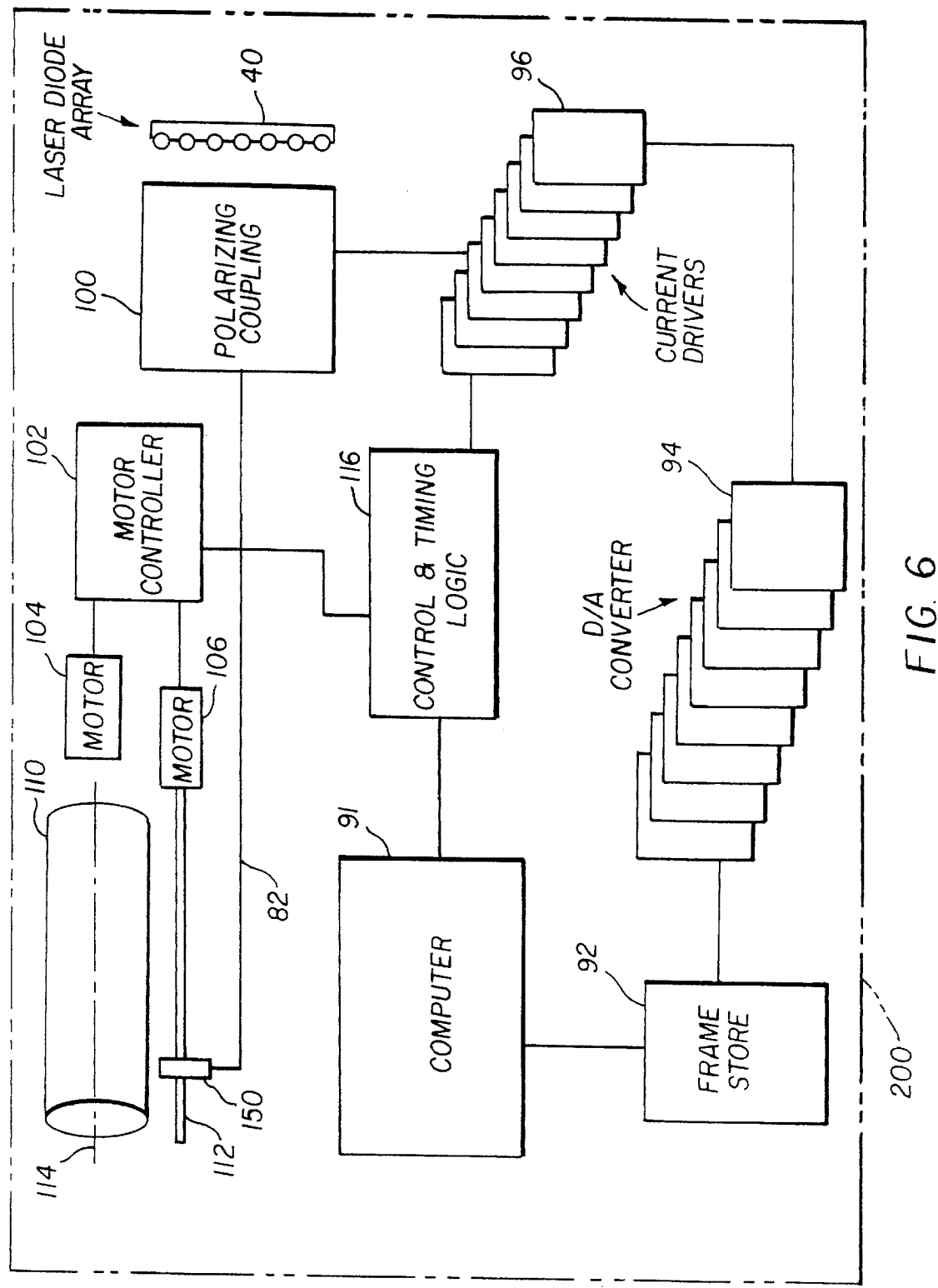
FIG. 6 shows a high-level block diagram of a thermal printer which incorporates the present invention.

With reference to FIG. 6, there is shown a block diagram of thermal printer 200 which incorporates the teachings of the present invention. As such printer 200 comprises drum 110 which is mounted for rotation about axis 114 and is driven by motor 104. Drum 110 is designed to support a thermal print medium, not shown. A thermal print medium for use with the printer 200 can be, for example, a medium disclosed in U.S. Pat. No. 4,772,582, entitled "Spacer Bead Layer for Dye-Donor Element Used in Laser Induced Thermal Dye Transfer", granted Sep. 20, 1988, assigned to the present assignee hereto and also incorporated by reference herein.

Print head 150 is movably supported adjacent drum 110 for slidable movement along a lead screw 112. The print head is driven by motor 104 which rotates the lead screw. Print head 150 comprises fiber optic array 60 (FIG. 4— not shown in FIG. 5). Optical fibers 48 in array 60 are coupled by the coupling of the present invention 100 to a plurality of diode lasers 40, typically arranged in an array. Each of diode lasers 40 can be individually modulated under the control of computer 91. In this manner, when an individual diode laser 40 is selectively energized, light rays emanating from that individual diode laser are coupled to individual optical fiber 48, by coupling 100, and are transmitted the length of the optical fiber 48 until the end of optical fiber 74 is reached. The light then exits the optical fiber 74 and strikes print medium located on drum 110. Since elements 102, 116, 96, 92 and 94 shown in FIG. 6 are all conventional, well-known and do not form part of the present invention, for the sake of brevity it is not necessary to discuss them in any detail.

Clearly, it should now be quite evident to those skilled in the art, that while my invention was shown and described in detail in the context of a preferred embodiment, and with various modifications thereto, a wide variety of other modifications can be made without departing from scope of my inventive teachings.

I claim:

1. An apparatus for coupling polarized light emitting from a multi-mode diode laser to an optical fiber comprising:

a half-wave plate, adjacent to the multi-mode diode laser in a path of the light such that substantially one-half of the light emitted from the multi-mode laser is rotated by the effect of the half-wave plate;

collecting optics, situated in the path of the light between the half-wave plate and the optical fiber; and a double refractive prism, situated in the path of the light between the collecting optics and the optical fiber such that the double refractive prism displaces substantially one-half of the light by an amount approximately equal to a diameter of the optical fiber so as to overlap substantially one-half of the light onto another one-half of the light which then is inserted into the optical fiber.

2. The apparatus according to claim 1 wherein the collecting optics comprises a lenslet array.

3. The apparatus according to claim 2 wherein the double refractive prism is constructed from a group consisting of calcite and quartz.

4. An optical fiber array for a printer, the optical fiber array comprising:

a plurality of optical fibers each having an input end and an output end wherein each one of said plurality of optical fibers is optically coupled by a coupling means at the input end to a multi-mode diode laser arranged in an array of diode lasers, said coupling means further comprising:

a half-wave plate, adjacent to the multi-mode laser in a path of the light such that the polarization of substantially one-half of the light emitted from the multi-mode laser is rotated by the effect of the half-wave plate;

collecting optics, situated in the path of the light between the half-wave plate and the plurality of optical fibers; and a double refractive prism, situated in the path of the light between the collecting optics and the plurality of optical fibers such that the double refractive prism displaces substantially one-half of the light by an amount approximately equal to a diameter of one of said plurality of optical fibers so as to overlap substantially one-half of the light onto another one-half of the light which is then inserted into one of said plurality of optical fibers.

5. The apparatus according to claim 4 wherein the collecting optics comprises a lenslet array.

6. The apparatus according to claim 5 wherein the double refractive prism is constructed from a group consisting of calcite and quartz.

* * * * *